(12) United States Patent
Cok

(10) Patent No.: US 6,911,772 B2
(45) Date of Patent: Jun. 28, 2005

(54) OLED DISPLAY HAVING COLOR FILTERS FOR IMPROVING CONTRAST

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 23 days.

(21) Appl. No.: 10/171,277

(22) Filed: Jun. 12, 2002

(65) Prior Publication Data

US 2003/0230972 A1 Dec. 18, 2003

(51) Int. Cl.[7] .................................................. H01J 1/62
(52) U.S. Cl. ......................... 313/501; 313/506; 313/113
(58) Field of Search ............................... 313/501, 506, 313/113, 504, 111, 112, 505

(56) References Cited

U.S. PATENT DOCUMENTS

| 5,559,400 | A | * | 9/1996 | Nakayama et al. | .......... | 313/506 |
| 5,834,894 | A | * | 11/1998 | Shirasaki et al. | ............ | 313/506 |
| 5,932,327 | A | * | 8/1999 | Inoguchi et al. | ............. | 313/506 |
| 5,981,092 | A | * | 11/1999 | Arai et al. | ................... | 313/504 |
| 6,117,529 | A | * | 9/2000 | Leising et al. | ............... | 428/457 |
| 6,226,890 | B1 | | 5/2001 | Boroson et al. | | |
| 6,268,295 | B1 | | 7/2001 | Ohta et al. | | |
| 6,274,979 | B1 | * | 8/2001 | Celii et al. | ................... | 313/506 |
| 6,468,715 | B2 | * | 10/2002 | Hoffend, Jr. et al. | ........ | 430/200 |
| 6,469,758 | B2 | * | 10/2002 | Yu | .............................. | 349/106 |
| 6,476,783 | B2 | | 11/2002 | Matthies et al. | | |
| 6,650,045 | B1 | * | 11/2003 | Forrest et al. | .............. | 313/504 |
| 2002/0024051 | A1 | | 2/2002 | Yamazaki et al. | | |
| 2003/0173897 | A1 | | 9/2003 | Iwase et al | | |

FOREIGN PATENT DOCUMENTS

| EP | 1 115 269 | 7/2001 |
| JP | 11-260562 | 9/1999 |
| JP | 11-345688 | 12/1999 |
| WO | WO 00/36665 | 6/2000 |

OTHER PUBLICATIONS

US Application Publications No. 20020024051, Yamazaki et al., Feb. 28, 2002.

* cited by examiner

Primary Examiner—Nimeshkumar D. Patel
Assistant Examiner—Sharlene Leurig
(74) Attorney, Agent, or Firm—Andrew J. Anderson; Thomas H. Close

(57) ABSTRACT

An OLED display device for displaying a color image, the display device being viewed from a front side includes a plurality of OLED elements including first color elements that emit a first color of light and second color elements that emit a second color of light different from the first color; a reflector located behind the OLED elements; and a corresponding plurality of filter elements aligned with the OLED elements, including first and second color filters for passing the first or second color of light emitted by the corresponding OLED element, and blocking other colors of light.

21 Claims, 5 Drawing Sheets

OLED DISPLAY HAVING COLOR FILTERS FOR IMPROVING CONTRAST

FIELD OF THE INVENTION

The present invention relates to organic light emitting diode (OLED) displays, and more particularly, to OLED displays having improved contrast and color gamut.

BACKGROUND OF THE INVENTION

Organic light-emitting diode (OLED) display devices utilize a current passed through thin-film layers of organic materials to generate light. Electrodes located on either side of the organic layers provide current to the organic layers. The color of the light depends on the specific organic material and the light is Lambertian and emitted in every direction. A portion of the light is emitted directly toward the front of the display device: through a substrate (for a bottom emitter device) or an encapsulating cover (for a top emitter device). A similar portion of the light is emitted toward the back of the display device and may be either absorbed or reflected by a layer behind the organic layers. If the portion of light emitted toward the back is reflected, it can pass through the organic layers again and be emitted through the front of the display, thereby increasing the brightness of the display. If the portion of the light emitted toward the back is absorbed, it is absorbed and lost.

In viewing conditions that include ambient illumination, it is important that a display device have a high contrast to improve the viewability of the display. The contrast is a ratio between light emitted from the display device and the ambient light reflected from the display device. If the contrast is very low, it is difficult for a viewer to see the display light rather than the ambient light. If the contrast is high, the display light is readily seen in comparison to the ambient light.

If the light emitted toward the back of an OLED device is absorbed, so will ambient light that enters the device. Thus, the contrast of the display is improved at the cost of half of the emitted light from the display device. If the light emitted toward the back of an OLED device is reflected, little display device light is lost but the contrast is degraded since any ambient light that enters the device is reflected back out.

Various means are known in the art to address problems with contrast. For example, circular polarizers may be placed on the front of a display device to enhance the contrast. 3M sells a circular polarizing filter HNCP37 which preferentially absorbs ambient light that passes twice through the filter rather than emitted light which passes once through the filter. Unfortunately, the polarizing filter still absorbs 60% of the emitted light, is expensive, and is exposed to the environment. Other means to provide absorbing layers by creating black layers, such as anodes or cathodes, are also known in the art. However, as described above, such an approach has the disadvantage of absorbing 50% of the emitted light.

There is a need therefore for an improved means to optimize the light output and the contrast in an OLED display device.

SUMMARY OF THE INVENTION

The need is met by providing an OLED display device for displaying a color image, the display device being viewed from a front side includes a plurality of OLED elements that includes first color elements that emit a first color of light and second color elements that emit a second color of light different from the first color; a reflector located behind the OLED elements; and a corresponding plurality of filter elements aligned with the OLED elements, including first and second color filters for passing the first or second color of light emitted by the corresponding OLED element, and blocking other colors of light.

ADVANTAGES

The present invention has the advantage that it increases the contrast of an OLED display device without significantly decreasing the light output from the device.

It will be understood that the figures are not to scale since the individual layers are too thin and the thickness differences of various layers too great to permit depiction to scale.

DETAILED DESCRIPTION OF THE INVENTION

The present invention is useful for both top-emitting OLED display devices (those that emit light through a cover placed above a substrate on which the OLED is constructed) and bottom-emitting OLED display devices (those that emit light through the substrate on which the OLED is constructed).

Figure 1:
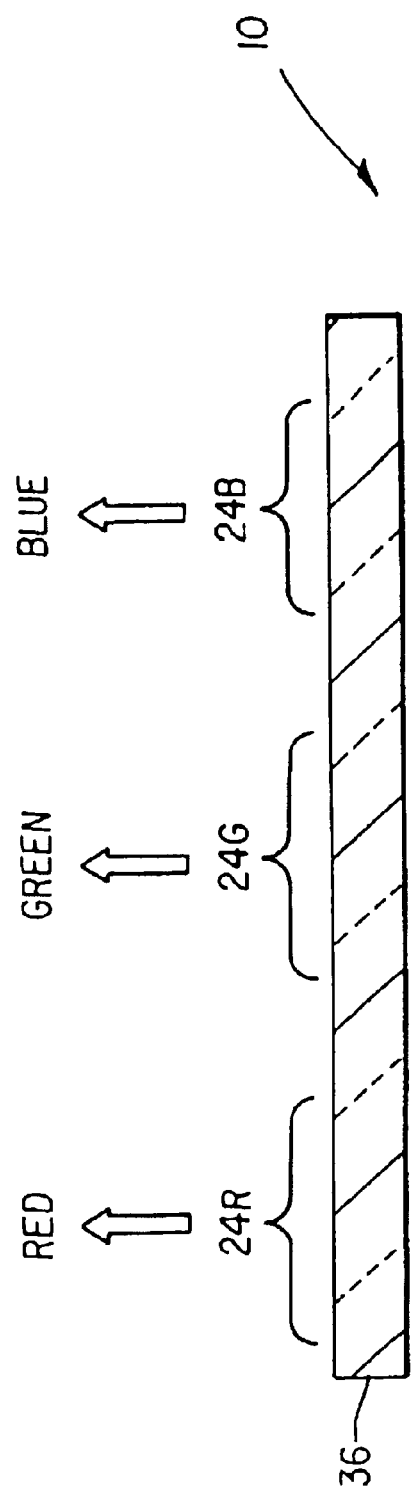
FIG. 1 illustrates a partial cross section of a prior art conventional top-emitting OLED display device.
Figure 1:
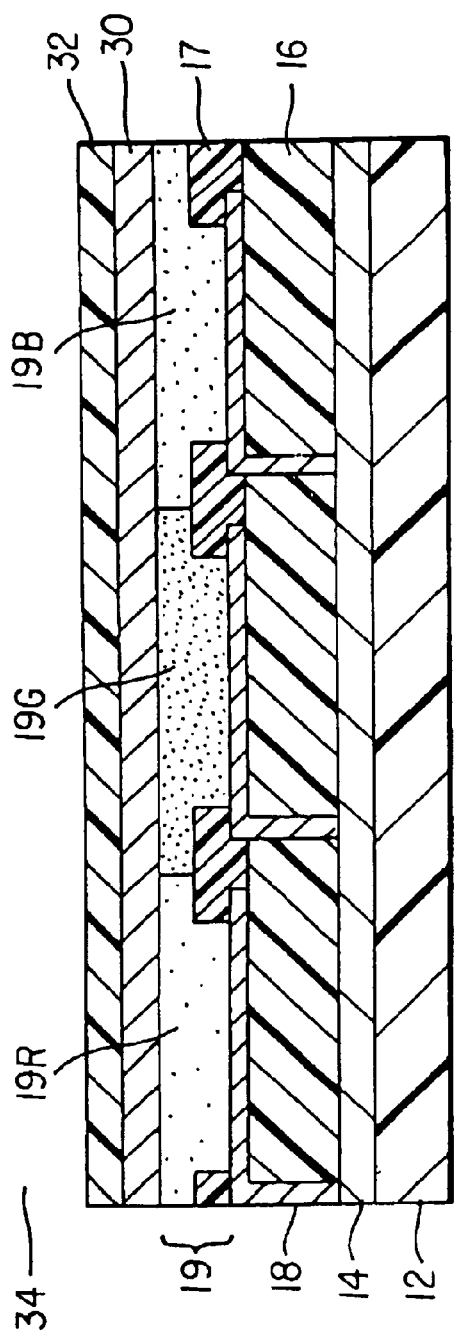

Referring to FIG. 1, a prior art top-emitting OLED display device 10 is shown with a substrate 12, and a thin-film transistor (TFT) active matrix layer 14 comprising an array of TFTs that provides power to OLED elements. A patterned first insulating layer 16 is provided over the TFT active matrix layer, and an array of first electrodes 18 are provided over insulating layer 16 and in electrical contact with the TFT active matrix layer. A patterned second insulating layer 17 is provided over the array of first electrodes 18 such that at least a portion of each of the first electrodes 18 is exposed. Over the first electrodes and insulating layers are provided red, green, and blue-emitting organic electroluminescent (EL) elements, 19R, 19G, and 19B, respectively. Herein, the collection of organic EL elements may also be referred to as the organic EL layer 19. The light-emitting area is generally defined by the area of the first electrode 18 in contact with the organic EL elements. Over the organic EL layer 19 is provided a transparent, common second electrode 30 that has sufficient optical transparency to allow transmission of the generated red, green, and blue light. An optional second electrode protection layer 32 may be used to protect the electrode and underlying layers. Each first electrode in combination with its associated organic EL element and second electrode is herein referred to as an OLED element.

A typical top-emitting OLED display device comprises an array of OLED elements wherein each OLED element emits red, green or blue. A gap 34, generally filled with inert gas or a transmissive polymer material separates the electrode protection layer from an encapsulating cover 36.

In operation, the thin-film transistors in TFT layer 14 allow current to flow between the first electrode 18, each of which can be selectively addressed, and the common second electrode 30. Holes and electrons recombine within the organic EL elements to emit light 24 R, G and B from the light emitting elements 19 R, G and B respectively.

Figure 2:
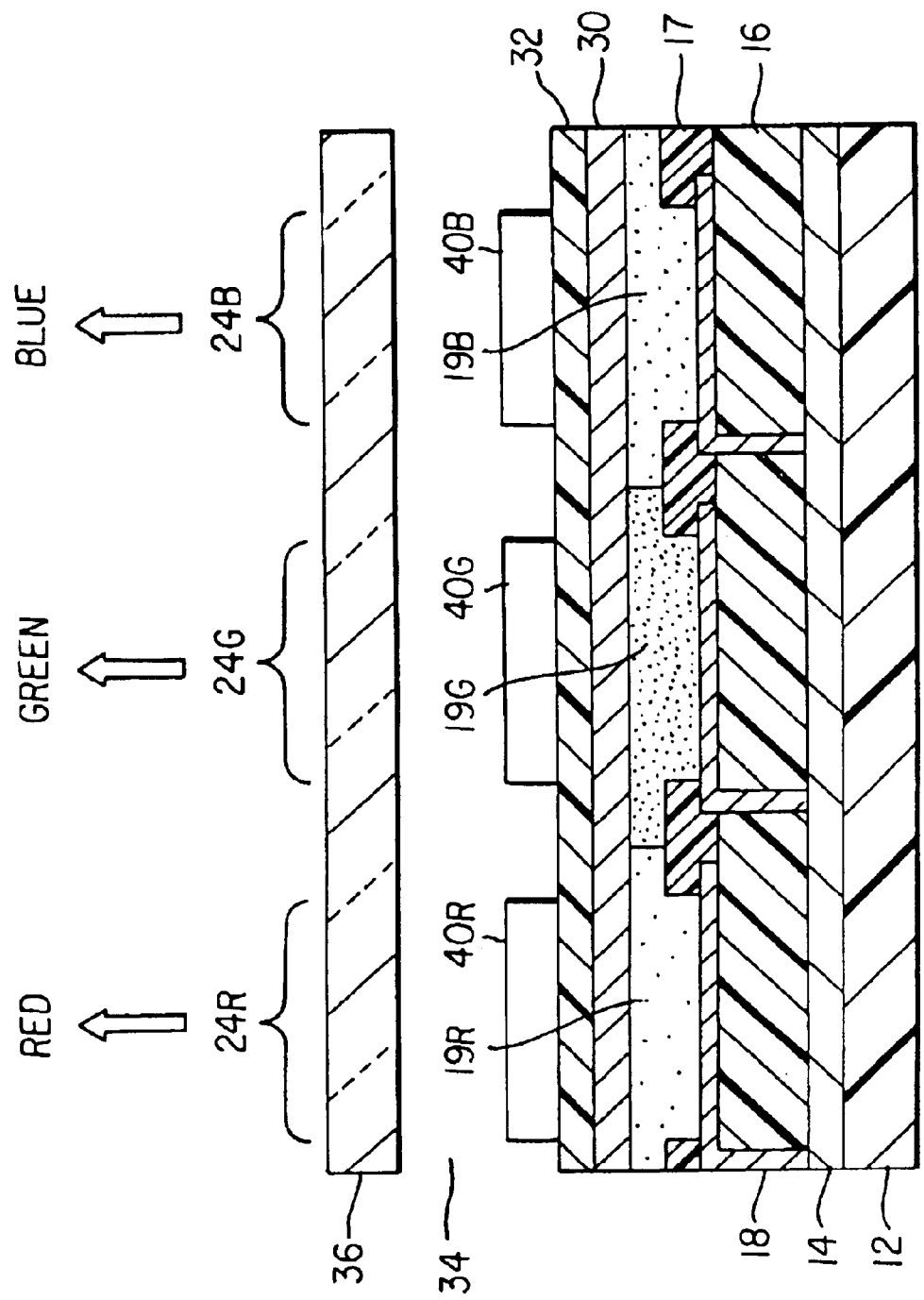
FIG. 2 is a partial cross section of a display having color filter elements located above the light emitting elements according to one embodiment of the present invention.

Referring to FIG. 2, in a first embodiment of a top-emitting OLED display device having filter elements according to the present invention, the first electrodes 18 are reflective, or a reflective layer (not shown) is provided under the first electrodes. The display device includes a filter layer 40R, 40G, and 40B provided over the light emitting elements. The filter layers 40 are the same, or nearly the same, color as the light emitting elements over which they are deposited. Suitable filter materials are used in the manufacture of charge-coupled imaging devices (CCDs) commercially available today and are deposited using conventional evaporation or sputtering means. These color filter arrays are conventionally used to filter ambient light that strikes an imaging device to render the image sensing sites color sensitive. The use of Color Filter Arrays is also known in OLED display devices and the color filter arrays are conventionally used to produce a colored display using white light emitting elements. For example, U.S. Application publication 20,020,024,051 A1, published Feb. 28, 2002, entitled "Light Emitting Device" describes such a design. Manufacturing is done with traditional masking means as is well known in the art and the materials (a separate material for each light emitter 19R, 19G, and 19B) are deposited over the cathode protection layer 32. Alternatively, the color filter layers can be provided on the inside or outside surface of cover 36, preferably on the inside to provide protection for the filter layers.

In operation, current is passed via the electrodes 18 and 30 through the light emitting elements 19 causing light to be emitted both upward through second electrode 30 and downward toward the substrate. The light that is emitted through second electrode 30 passes through filter layer 40 and is emitted through the encapsulating cover 36. Light that is emitted toward the substrate 12 is reflected from the first electrodes 18 and passes through the light emitters and the filter layer 40 and is emitted through the cover 36. According to the present invention, the spectrum of the emitted light approximately matches that of the filter. Little light is lost and almost all of the light is emitted from the device, even the light that is reflected from the electrodes 18. Preferably, the spectral properties of the filter are selected so that >80% of the incident light generated by the pixel is transmitted.

Ambient light can enter the device through the cover 36 and only a portion of the ambient light is passed by the filter layer 40. The spectrum for each of the filters, Red, Green, and Blue is different. If the spectrum passed by each of the color filters is considered to be about one third of the visible spectrum for each of the three colors, the light reflected from the display is only one third of the ambient light incident on the display, thereby improving the contrast of the display.

Figure 3:
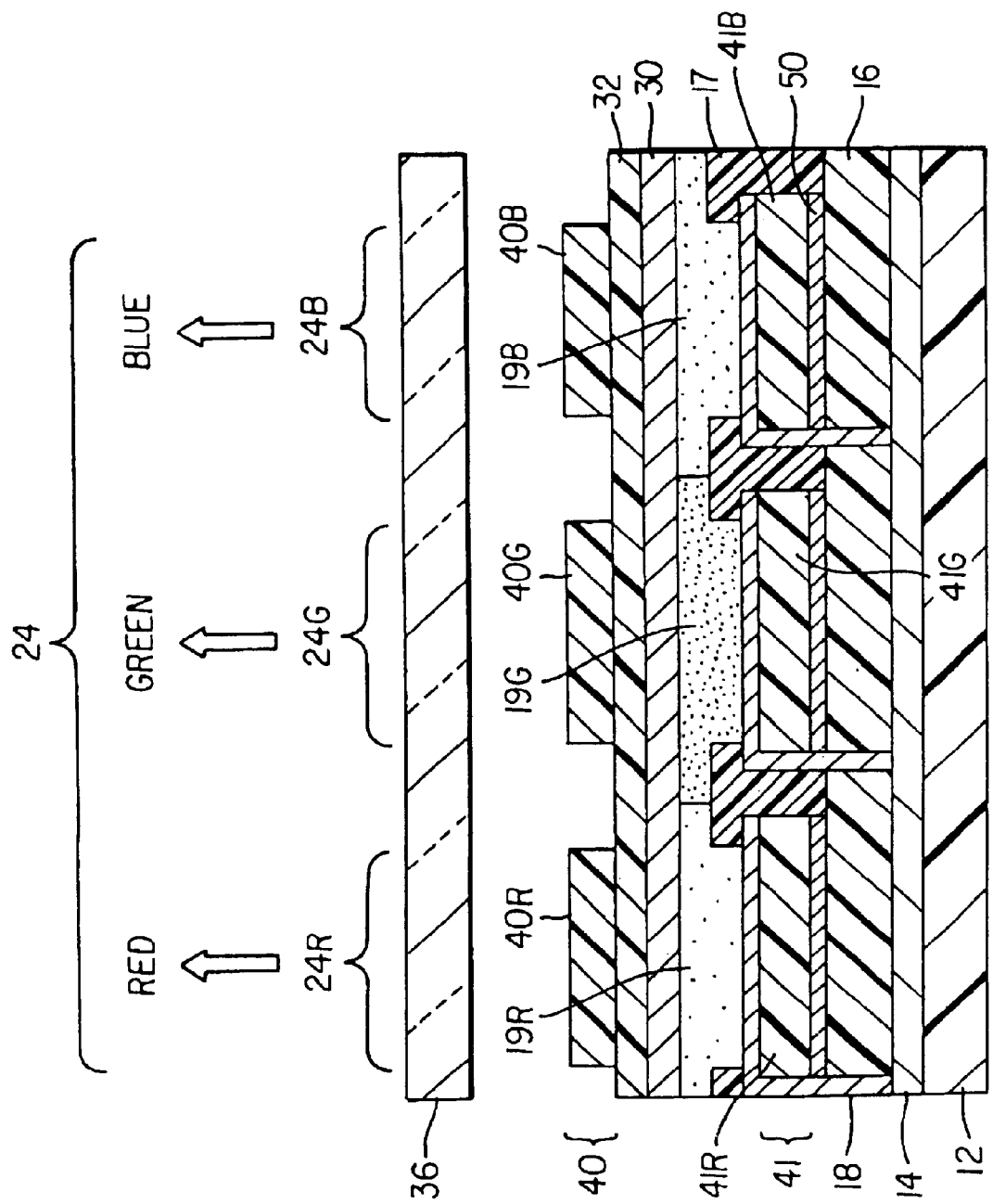
FIG. 3 is a partial cross section of a display having color filter elements located above and below the light emitting elements according to an alternative embodiment of the present invention.

Referring to FIG. 3, in an alternative embodiment of a top-emitting OLED device of the present invention, the first electrode layer 18 is transparent. A reflector layer 50 is located between first insulating layer 16 and the transparent first electrode 18. The reflector layer 50 can be for example, a patterned layer of a reflective metal including, but not limited to, silver, chromium, molybdenum or aluminum. Such a layer must be patterned so as to prevent shorting between first electrodes. A reflective dielectric stack as known in the art may also be used as reflector layer 50. Because a dielectric stack is not conductive, there is less risk of shorting between first electrodes. Also, a dielectric stack mirror can be deposited as a continuous film over the first insulating layer, and vias for first electrode 18 can be patterned along with the first insulating layer. Alternatively, a dielectric stack mirror can serve the function of first insulator layer. By "reflective", it is meant that at least 50% of the incident light is reflected. Preferably, it is greater than 70%, and more preferably, greater than 90%. A filter layer 41R, 41G, and 41B as described above is provided between the reflector layer 50 and the transparent first electrode 18. Transparent electrodes are well known in the art and the application of reflective films is also well known. Alternatively, the insulating layer 16 itself may serve as a color filter if a reflective layer is provided underneath it.

It should be noted that the display device may include only filter layers 41 located below the light emitting elements, or filter elements 40 and 41 may be provided both above and below the light emitting elements (as shown in FIG. 3). In operation, both the reflected and directly emitted light will pass through the filter above the second electrode and be seen by a viewer. Ambient light outside the filter spectrum will be absorbed as described above. Since the filters are not perfect and do not absorb all of the appropriate light passing through them, the use of multiple filters can further improve the contrast of the display.

The filter layers 40 and 41 can also be trimming filters that are used to modify the spectrum of the emitters. By trimming filters, it is meant that the spectrum of light passed by the filter is narrower than the spectrum of light emitted by the OLED. Since some OLED materials do not have quite the desired emissive spectrum for a given display application, unwanted light emitted from such materials can be absorbed by suitable trimming filters designed for each color. This approach somewhat reduces the brightness of the display, but can be used to improve the color gamut of the display while improving the contrast of the display.

Color filter arrays can also be placed on the encapsulating cover 36, either on the inside or outside surface of the cover. By providing the cover with a properly aligned array of filters, the light from each light emitter can be suitably filtered. Preferably, the filter array is located on the inside of the cover, thereby reducing the environmental exposure of the filter elements.

In another embodiment, the present invention can be applied to a bottom-emitter OLED display device. In a bottom-emitter device, the filter elements can be located on either side of the substrate, behind the light emitting elements, or on a cathode protection layer, or on the encapsulating cover. The reflective layer is located behind the filter elements, for example on the inside of a reflective encapsulating cover.

Figure 4:
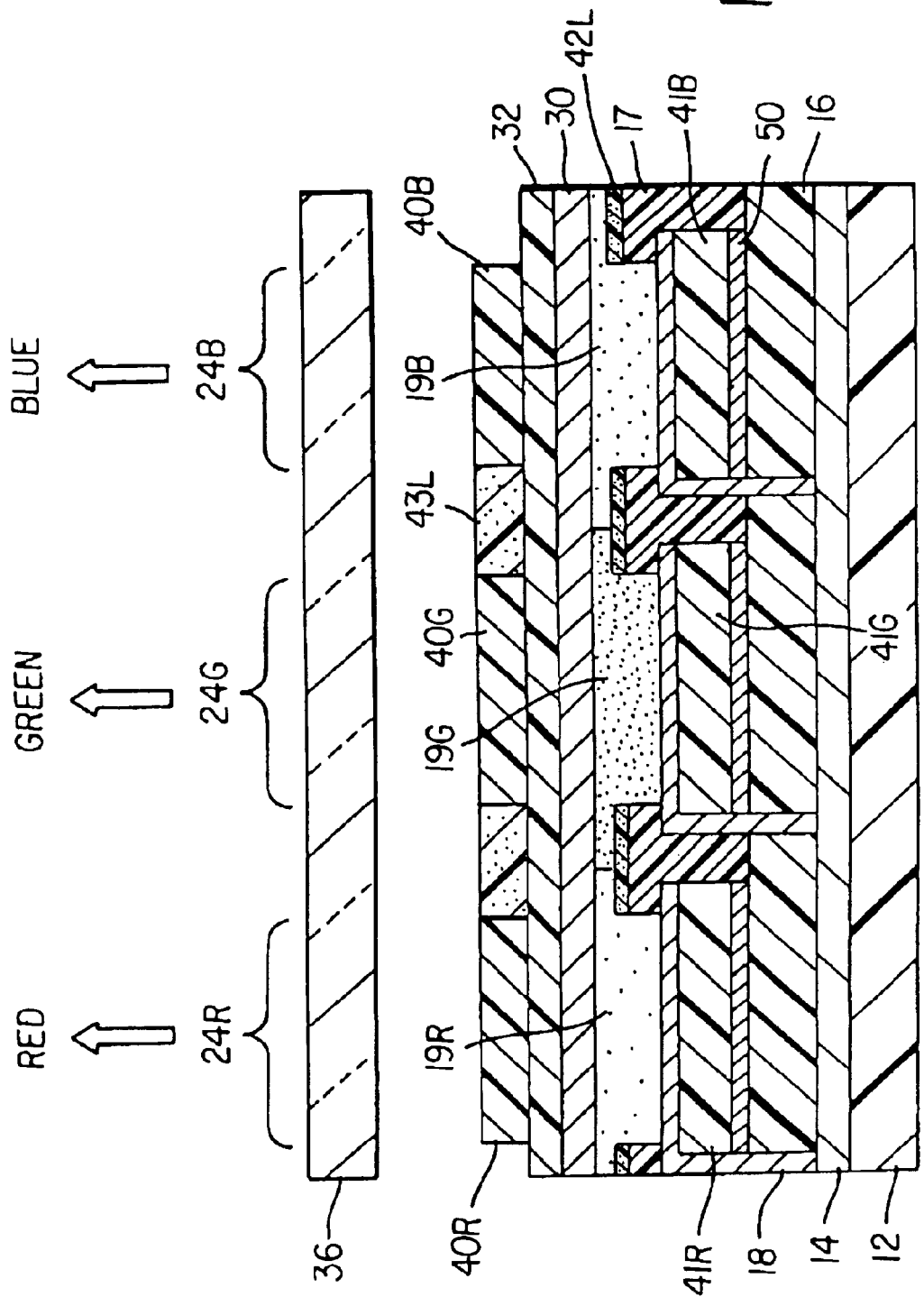
FIG. 4 is a partial cross section of a display having color filter elements and a black matrix according to a further alternative embodiment of the present invention.

In a typical OLED display device, the light emitting elements do not cover the entire substrate. It is known to provide a pattern of light absorbing material in the spaces between the light emitting elements. Such patterns of light absorbing material can enhance the contrast of the device with no loss of light output from the device. The degree of contrast improvement is dependent on the fill factor of the display. The lower the fill factor of the display the more the contrast is improved by use of such patterns of light absorbing material. Suitable materials for creating black layers are known in the art and can include, for example, carbon black. The present invention may be practiced together with such light absorbing patterns located above, beneath, or within the layers of the OLED device. Referring to FIG. 4, for example, a pattern of black absorbing material 42L may be placed above either the second insulating layer 17 or above the cathode sealing layer 32L or in conjunction with the color filters.

The same approach can be used for a bottom-emitting device. By locating a pattern of light absorbing material in, above, or beneath the portions of layers that do not obscure light emission, contrast can be improved.

An alternative to the use of black light absorbing material is to overlap the color filters in the regions between the light emitting elements to form a wide spectrum light absorbing pattern. For example, in regions where red and blue filter elements overlap all light will be effectively absorbed.

It may also be useful to include additional layers to provide compatibility between the filter materials and other layers of the OLED device, for example to promote adhesion of the filter material, to provide a smooth surface, or to protect the filter material. For example, silicon oxide layers are often used to meet these needs.

When provided, the protection layer 32 for top emitting display devices may comprise inorganic materials such as SiOx or SiNx, for example, as disclosed in JP 2001126864. Alternatively, the protection layer 32 may comprise organic materials such as polymers, including but not limited to, Teflon®, polyimides, and polymers disclosed in JP 11162634. Protection layer 32 may comprise multiple layers of organic or inorganic materials, or combinations thereof Alternating inorganic and organic layers, for example, as disclosed in U.S. Pat. No. 6,268,295 issued Jul. 31, 2001 to Ohta et al., and WO 00/36665 by Graff et al., published Jun. 22, 2000, are useful as protection layer 32. In all cases, the protection layer 32 should have high optical transparency, preferably greater than 70% transmittance. For convenience, the combination of layers from the substrate through the optional protection layer is referred to herein as the OLED substrate.

The filtering materials 40 and 41 may be deposited in a pattern using photolithographic techniques known in the art. For example, light absorbing material may be coated as a liquid on the entire surface and exposed to radiation through a mask to polymerize portions of the coating. Portions of the material exposed to the radiation are cured and the remainder is washed away. Dry film photolithography may also be used. In addition, patterned thermal transfer can be used, for example, by coating filter material 40 and 41 onto a donor substrate, placing the donor substrate in contact or close proximity to the OLED substrate, and selectively heating the donor with a laser to cause transfer of the filtering material to the OLED substrate. The filtering material 40 and 41 may comprise a plurality of thinner layers deposited by sequential deposition of filter materials.

While transparent cover 36 is typically glass or plastic sheet, the cover can comprise materials that are deposited in a conformable manner over the surface of the materials deposited over the substrate, i.e., over OLED substrate with patterned filtering material 40 and 41. The same materials useful as protection layer 32 can be used as a transparent conformable cover (not shown).

This invention is advantageously practiced with both top-emitting and bottom-emitting OLED active matrix devices. This invention may be used in any OLED device including simple matrix or passive matrix devices.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

Figure 5:
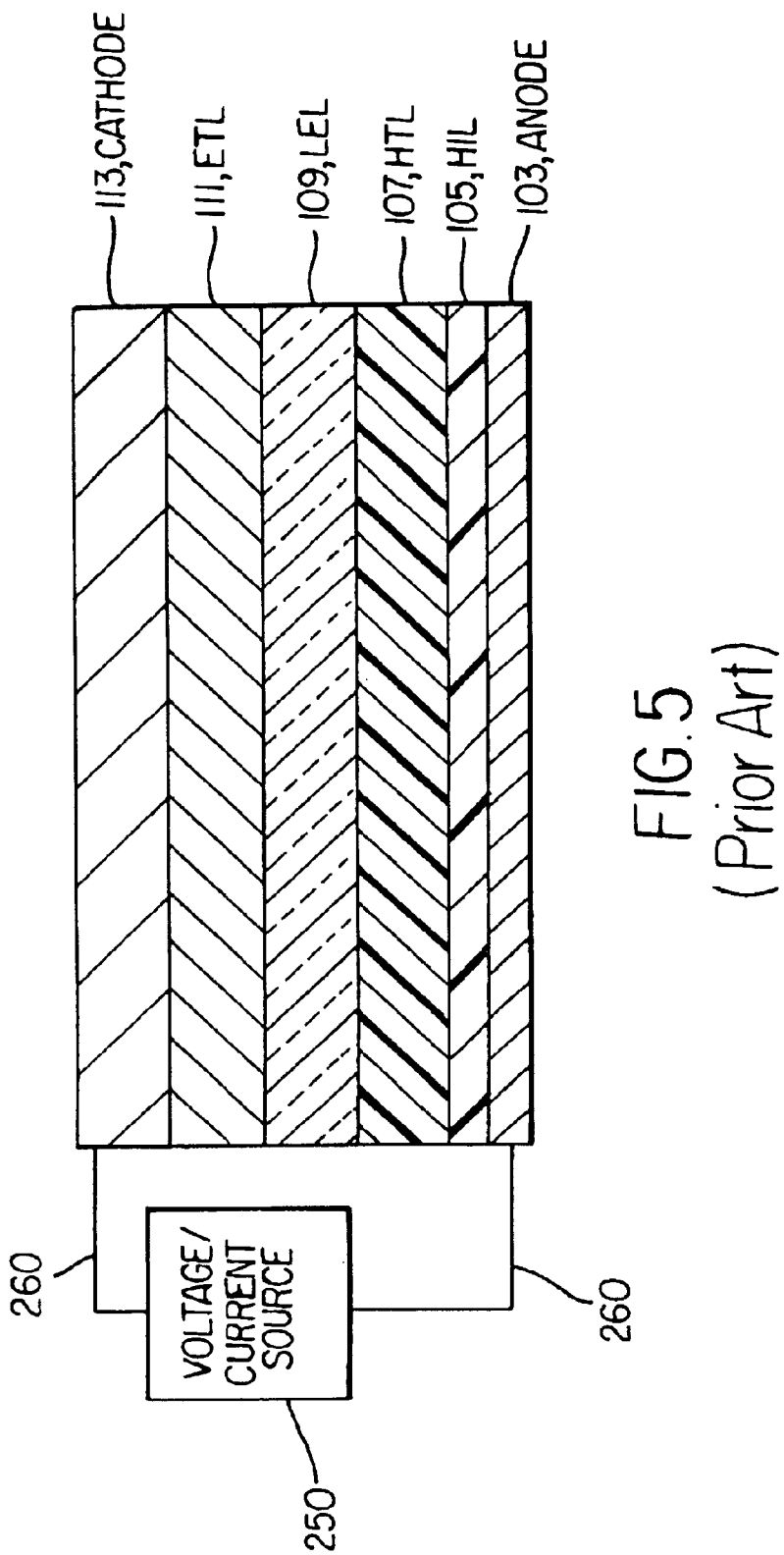
FIG. 5 is a cross sectional view of a typical OLED element known in the art that illustrates some of the various layers that can be used to construct an OLED element.

There are numerous configurations of the organic layers wherein the present invention can be successfully practiced. A typical structure is shown in FIG. 5 and is comprised of an anode layer 103, a hole-injecting layer 105, a hole-transporting layer 107, a light-emitting layer 109, an electron-transporting layer 111, and a cathode layer 113. These layers are described in detail below. Note that the substrate may be located adjacent to the cathode, or the substrate may actually constitute the anode or cathode. The organic layers between the anode and cathode are conveniently referred to as the organic EL element. The total combined thickness of the organic layers is preferably less than 500 nm.

Substrate

The OLED device of this invention is typically provided over a supporting substrate 12, which as previously described, may also comprise other layers such as TFT electronics and insulating layers. The electrode provided over the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

Anode

When EL emission is viewed through anode 103, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where the anode is reflective, conductors may include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

It is often useful to provide a hole-injecting layer 105 between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,769,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline(oxine) and similar derivatives constitute one class of useful host compounds capable of supporting electroluminescence. Illustrative of useful chelated oxinoid compounds are the following:

CO-1: Aluminum trisoxine[alias, tris(8-quinolinolato)aluminum(III)]
CO-2: Magnesium bisoxine[alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine[alias, tris(8-quinolinolato)indium]
CO-6: Aluminum tris(5-methyloxine)[alias, tris(5-methyl-8-quinolinolato)aluminum(III)]
CO-7: Lithium oxine[alias, (8-quinolinolato)lithium(I)]
CO-8: Gallium oxine[alias, tris(8-quinolinolato)gallium (III)]
CO-9: Zirconium oxine[alias, tetra(8-quinolinolato)zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2,2',2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, layers 111 and 109 can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Cathode

When light emission is viewed solely through the anode, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, and U.S. Pat. No. 6,278,236. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The invention has been described in detail with particular reference to certain preferred embodiments thereof, but it will be understood that variations and modifications can be effected within the spirit and scope of the invention.

PARTS LIST 10 top-emitting OLED device
12 substrate
14 TFT active matrix layer
16 first insulating planarization layer
17 second insulating layer
18 first electrode
19 organic EL layer
19B blue-emitting organic EL element
19G green-emitting organic EL element 19R red-emitting organic EL element
24 emitted light
24B blue emitted light
24G green emitted light
24R red emitted light
30 transparent second electrode
32 cathode protection layer
34 gap
36 encapsulating cover
40 filter element layer
40R red filter element
40G green filter element
40B blue filter element
41 filter element layer
41R red filter element
41G green filter element
41B blue filter element
42L patterned light absorbing layer
43L patterned light absorbing layer
50 reflector layer
103 anode layer
105 hole-injecting layer
107 hole-transporting layer
109 light-emitting layer
111 electron-transporting layer
113 cathode layer
250 voltage/current source
260 conductive wiring

What is claimed is:

1. An OLED display device for displaying a color image, the display device being viewed from a front side, comprising:
   a) a plurality of OLED elements including first color elements that emit a first color of light and second color elements that emit a second color of light different from the first color, each OLED element comprising a first electrode further from the front side, a second electrode closer to the front side, and an organic electroluminescent element between the first and second electrodes;
   b) where the first electrode of each OLED element is reflective, or a reflector is located behind the OLED elements; and
   c) a corresponding plurality of color filter elements aligned with the OLED elements, including first and second color filters for passing the first or second color of light emitted by the corresponding OLED element, and blocking other colors of light, wherein the first and second color filters pass greater than 80% of the first or second color of light emitted by the corresponding aligned OLED element.

2. The display device claimed in claim 1, wherein the colors of light include red, green, and blue.

3. The display device claimed in claim 1, wherein the OLED display device is a top emitting device.

4. The display device claimed in claim 1, wherein the OLED display device is a bottom emitting device.

5. An OLED display device for displaying a color image, the display device being viewed from a front side, comprising:
   a) a plurality of OLED elements including first color elements that emit a first color of light and second color elements that emit a second color of light different from the first color, each OLED element comprising a first electrode further from the front side, a second electrode closer to the front side, and an organic electroluminescent element between the first and second electrodes;
   b) where the first electrode of each OLED element is reflective, or a reflector is located behind the OLED elements; and
   c) a corresponding plurality of color filter elements aligned with the OLED elements, including first and second color filters for passing the first or second color of light emitted by the corresponding OLED element, and blocking other colors of light, wherein the color filter elements are located behind the OLED elements between the OLED elements and a reflector.

6. The display device claimed in claim 1, wherein the color filter elements are located in front of the OLED elements.

7. The display device claimed in claim 6, further including a second corresponding plurality of color filter elements located behind the OLED elements between the OLED elements and a reflector.

8. The display device claimed in claim 3, further comprising an encapsulating cover and wherein the color filter elements are located on the encapsulating cover.

9. The display device claimed in claim 8, wherein the color filter elements are located on the inside of the cover.

10. The display device claimed in claim 8, wherein the color filter elements are located on the outside of the cover.

11. The display device claimed in claim 4, further comprising a substrate and wherein the color filter elements are located on the substrate.

12. The display device claimed in claim 11, wherein the color filter elements are located on the inside of the substrate.

13. The display device claimed in claim 11, wherein the color filter elements are located on the outside of the substrate.

14. The display device claimed in claim 1, further comprising a black matrix surrounding the color filter elements.

15. An OLED display device for displaying a color image, the display device being viewed from a front side, comprising:
   a) a plurality of OLED elements including first color elements that emit a first color of light and second color elements that emit a second color of light different from the first color, each OLED element comprising a first electrode further from the front side, a second electrode closer to the front side, and an organic electroluminescent element between the first and second electrodes;
   b) where the first electrode of each OLED element is reflective, or a reflector is located behind the OLED elements; and
   c) a corresponding plurality of color filter elements aligned with the OLED elements, including first and second color filters for passing the first or second color of light emitted by the corresponding OLED element, and blocking other colors of light; further comprising a black matrix surrounding the color filter elements, wherein the black matrix is located behind the OLED elements between the OLED elements and a reflector.

16. The display device claimed in claim 14, wherein the black matrix is located in front of the OLED elements.

17. The display device claimed in claim 2, wherein the filter elements are trimming filters.

18. The display device claimed in claim 1, wherein the color filter elements partially overlap to provide a black matrix.

19. The display device claimed in claim 1, further comprising a protective layer located adjacent to the color filter elements.

20. The display device claimed in claim 19, wherein the protective layer is a silicon oxide.

21. The display device claimed in claim 5, wherein the first and second color filters pass greater than 80% of the first or second color of light emitted by the corresponding aligned OLED element.

* * * * *